United States Patent [19]

Kelkar et al.

[11] Patent Number: 5,663,991
[45] Date of Patent: Sep. 2, 1997

[54] INTEGRATED CIRCUIT CHIP HAVING BUILT-IN SELF MEASUREMENT FOR PLL JITTER AND PHASE ERROR

[75] Inventors: Ram Kelkar, So. Burlington; Ilya Iosephovich Novof, Essex Junction; Stephen Dale Wyatt, Jericho, all of Vt.

[73] Assignee: International Business Machines Corporation, Armonk, N.Y.

[21] Appl. No.: 613,276

[22] Filed: Mar. 8, 1996

[51] Int. Cl.[6] .................................................. H03D 3/24
[52] U.S. Cl. ................................... 375/376; 375/226
[58] Field of Search ........................... 329/50; 331/1; 375/376, 226

[56] References Cited

U.S. PATENT DOCUMENTS

| | | | |
|---|---|---|---|
| 4,363,002 | 12/1982 | Fuller | 331/1 |
| 4,743,857 | 5/1988 | Childers | 329/50 |
| 4,795,985 | 1/1989 | Gailbreath, Jr. | 375/376 |
| 4,821,297 | 4/1989 | Bergmann et al. | 375/376 |
| 4,926,447 | 5/1990 | Corsetto et al. | 375/376 |

*Primary Examiner*—Stephen Chin
*Assistant Examiner*—Joseph Roundtree
*Attorney, Agent, or Firm*—Schmeiser, Olsen & Watts; Robert A. Walsh

[57] ABSTRACT

A built-in system and method is provided that measures Phase Lock Loop (PLL) output clock error. An edge sorting circuit is utilized to measure jitter between corresponding transition edges of a measured clock and a reference clock, and then stores the value in an N bit word. A decoder circuit reads in the value and increments a corresponding counter. A state machine then reads the counters, processes the information and outputs one or more PLL clock error values.

19 Claims, 6 Drawing Sheets

INTEGRATED CIRCUIT CHIP HAVING BUILT-IN SELF MEASUREMENT FOR PLL JITTER AND PHASE ERROR

BACKGROUND OF THE INVENTION

1. Technical Field

This invention generally relates to systems for measuring clock error, and more specifically relates to a built-in self measurement circuit for measuring output clock error of Phase Lock Loop Circuits.

2. Background Art

A PLL (Phase Locked Loop) is widely used in logic circuits for clock generation. For instance, PLL circuits are utilized in many applications to provide an output signal that is of the same phase and frequency as an input reference signal. In addition, PLL's are widely used in Advanced Instruction Set Integrated Circuit (ASIC) chips for clock synchronization and multiplication to facilitate high speed chip to chip communication. However, like most electronic devices that manipulate clock signals, PLL's have some small amount of error associated with their operation. Because of the high degree of precision required by many of today's advanced digital systems, having knowledge of the error associated with a given PLL is important for circuit designers and manufacturers. Until now, no reliable system or method has existed to accurately measure PLL error.

As noted above, every PLL produces some amount of undesirable error (or jitter) in its output clock whose magnitude is usually small and difficult to measure. In particular, PLL output clock error may include signal delays of the output signal with respect to an input reference signal or it may involve an output signal whose frequency varies. PLL clock error plays an especially important role when dealing with high speed communication between ASIC chips, where clock latency must be removed on each ASIC chip and circuit developers must account for PLL jitter in their timing paths. Because the allowable clock skew budget between chips must be reduced by the amount of PLL jitter, accurate knowledge of PLL jitter is critical in avoiding system failures.

Unfortunately, the ability to accurately measure output clock error has become increasingly difficult because new PLL circuits have reduced PLL error to a point where production testers used for ASIC tests cannot accurately measure jitter. Furthermore, even though certain PLL parameters can be measured and tested, there exists no guarantee that a PLL could still exhibit jitter above its specification.

One known method for measuring PLL error involves the use of off chip measurement equipment. Unfortunately, these methods create problems in that the errors introduced by probes, connection cables, and the like may often be comparable to the magnitude of the error being measured. Known systems have sought to solve such problems by implementing built-in self test circuitry. U.S. Pat. No. 5,381,085 issued to Fischer entitled "Phase Lock Loop With Self Test Circuitry and Method Using the Same" discloses a system and method for measuring the ratio between the input and output frequency of a PLL. Unfortunately, this system and method fail to provide any discrete information regarding PLL output clock jitter.

Other known systems and methods have been used to calibrate clock signals, but again, none are known to provide built-in components for error measurement of a PLL. For instance, U.S. Pat. No. 5,220,581 issued to Ferraiolo et al. and assigned to International Business Machines, Inc. entitled "Digital Data Link Performance Monitor" teaches a technique for calibrating data timing jitter within a digital communication link. This system is concerned with monitoring digitally transmitted signals at a receiving point to select an appropriate clock phase. Thus, while many known systems utilize methods for performing clock recovery and clock calibration, none are known to provide a built-in system that provides an accurate and discrete measurement of clock error within a PLL circuit. Thus, a need exists for a built-in self test system for measuring PLL clock error. The aforementioned art is herein incorporated by reference.

DISCLOSURE OF INVENTION

The present invention provides a system and method for measuring the amount of clock error produced by a PLL. This is accomplished this by measuring the delay between transition edges of a PLL output clock (i.e., a measured clock signal) and a reference clock. The system and method utilize a sorting circuit that creates N−1 time delayed reference clock signals and then captures the value of the measured clock signal at the transition edges of the N−1 time delayed reference clock signals. Also provided is a means of generating calibrated time slices using delay elements with controllable delay and a calibration circuit. The system and method further include a decoder for reading in the captured information and incrementing a counter that corresponds to a time slice representing the delay of the measured clock signal. That information is further processed by a state machine to determine one or more PLL clock error values. One type of error value, referred to herein as peak-to-peak jitter, may be defined as the maximum difference between two clock edges of the output signal. Another type of error, static phase error, may be defined as the mean of the time difference between the edges of the output clock versus a reference clock.

It is therefore an advantage of the present invention to provide an accurate built-in self measurement circuit for measuring error associated with a PLL.

It is therefore a further advantage of the present invention to facilitate the self-measurement of a PLL without the use of expensive test equipment.

It is therefore a further advantage of the present invention to integrate the system and method as part of the PLL itself.

It is therefore a further advantage of the present invention to perform PLL testing on the production line.

It is therefore a further advantage of the present invention to provide discrete PLL clock error values.

It is therefore a further advantage of the present invention to provide definitions for peak-to-peak jitter and static phase error.

It is therefore a further advantage of the present invention to avoid shipping hardware that exceeds the jitter specification.

The foregoing and other objects, features and advantages of the invention will be apparent from the following more particular description of (a) preferred embodiment(s) of the invention, as illustrated in the accompanying drawing(s).

BRIEF DESCRIPTION OF DRAWINGS

The preferred exemplary embodiment of the present invention will hereinafter be described in conjunction with the appended drawings, where like designations denote like elements, and.

BEST MODE FOR CARRYING OUT THE INVENTION

Figure 1:
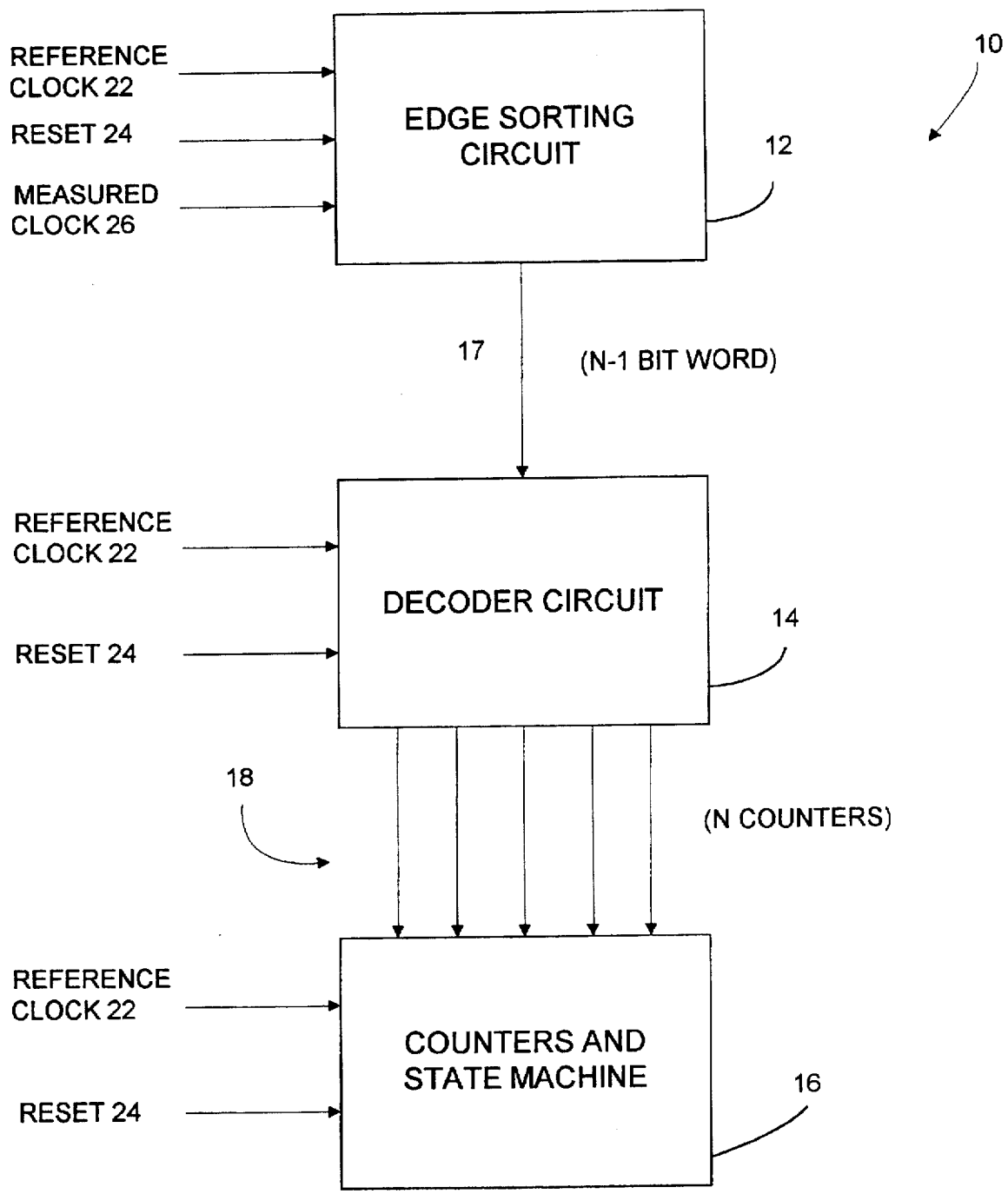
FIG. 1 depicts a block diagram showing the high level components of a preferred embodiment in accordance with the present invention.

Referring now to the drawings, FIG. 1 depicts a high level block diagram 10 showing the components of a system that measures the PLL timing error between a reference clock (e.g., the input to a PLL) and a measured clock (i.e., the output of a PLL). The system shown includes an edge sorting circuit 12 that receives the reference clock signal 22, a reset signal 24, and the measured clock signal 26. Also included is a decoder circuit 14 that receives the reference clock signal 22, the reset signal 24 and output information 17 from the sorting circuit 12. Additionally, the system includes counters and a state machine 16 that receive the reference clock signal 22, the reset signal 24 and output information 18 from the decoder circuit 14.

To begin measurement, the reset signal 24 is pulled low to allow the reference clock and the measured clock signal to be applied to the edge sorting circuit 12. (Setting the reset signal high stops the measurement). The main function of the edge sorting circuit 12 is to help measure the jitter, defined as the delay between the transition edge of the reference clock signal and the measured clock signal. The edge sorting circuit 12 functions by sorting transition edges of a measured clock into one of several possible time slices wherein each time slice represents a different time lag of the measured clock behind the reference clock. The edge sorting circuit 12 sorts the transition edges of the measured clock signal 26 into N time slices defined by the reference clock 22 and N−1 delay lines in the sorting circuit. Although this embodiment describes a system and method that sorts rising edges, the edge sorting circuit may sort rising edges, falling edges or both. The output 17 of the edge sorting circuit 12 is an N−1 bit word (e.g., 0001) for each measured transition edge. Up to N different N−1 bit word values may be output by the edge sorting circuit 12 such that each different word value corresponds to a different time lag. (The detailed operation of an edge sorting circuit is discussed further with respect to FIGS. 2 & 3.)

While reset 24 is pulled low, the decoder circuit 14 receives the N−1 bit word for each measured transition edge, decodes the value and increments a corresponding counter. Once the reset 24 is set to high, the measurement process stops and a state machine examines the counters, processes the information, and generates timing error information as one or more PLL clock error values.

Figure 2:
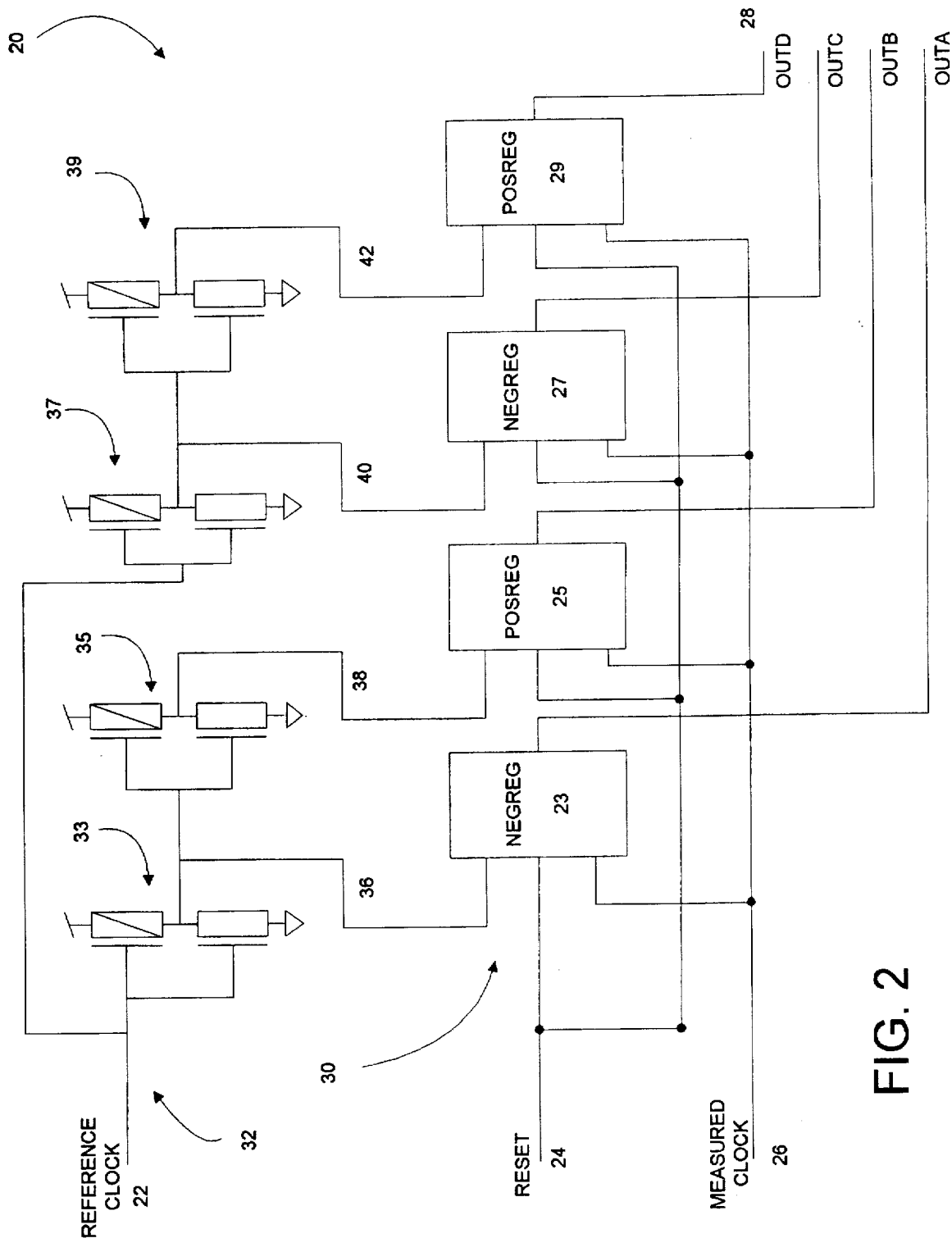
FIG. 2 depicts an edge sorting circuit in accordance with a preferred embodiment of the present invention.
Figure 5:
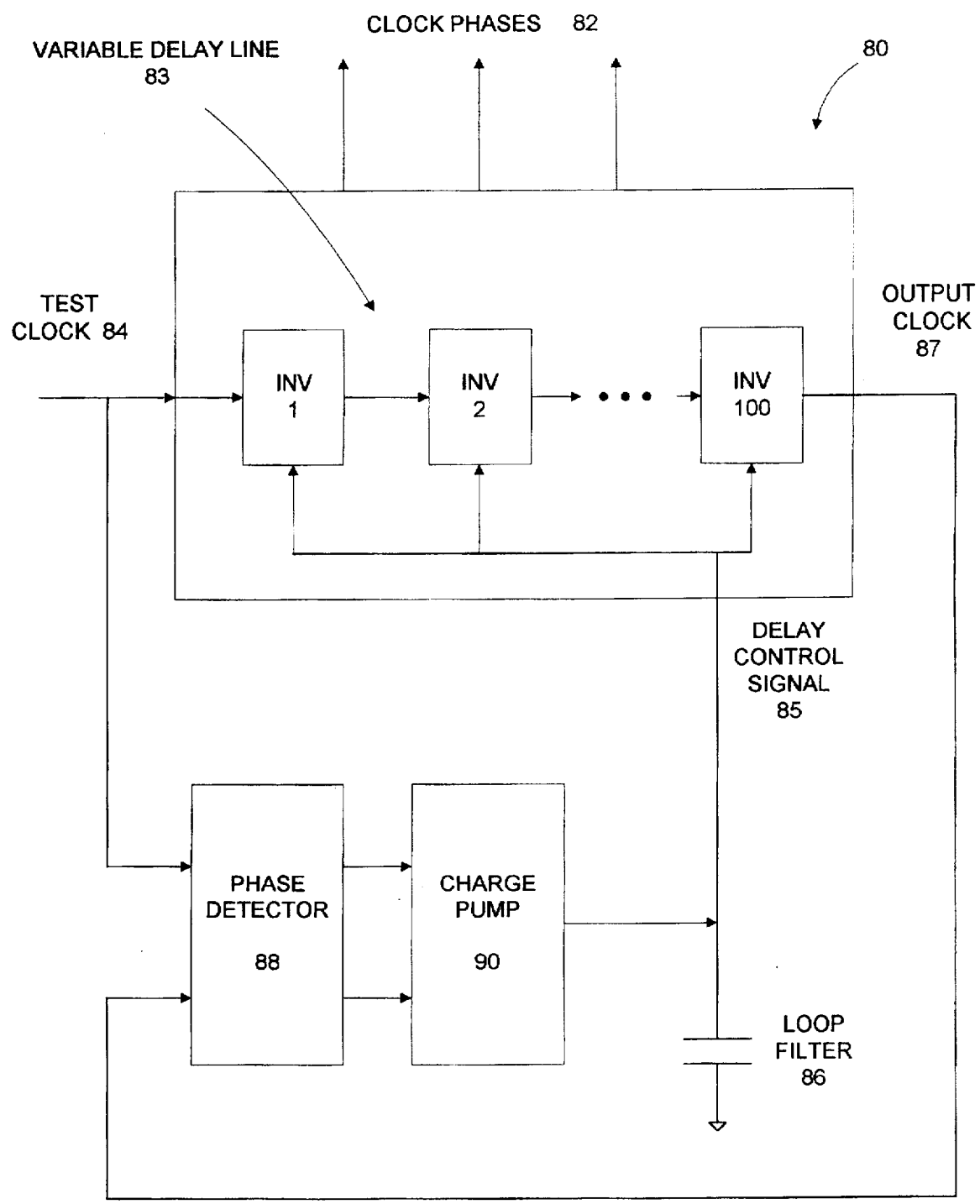
FIG. 5 depicts a circuit diagram in accordance with the present invention capable of generating calibrated time slices using delay elements with controllable delay and a calibration circuit.
Figure 6:
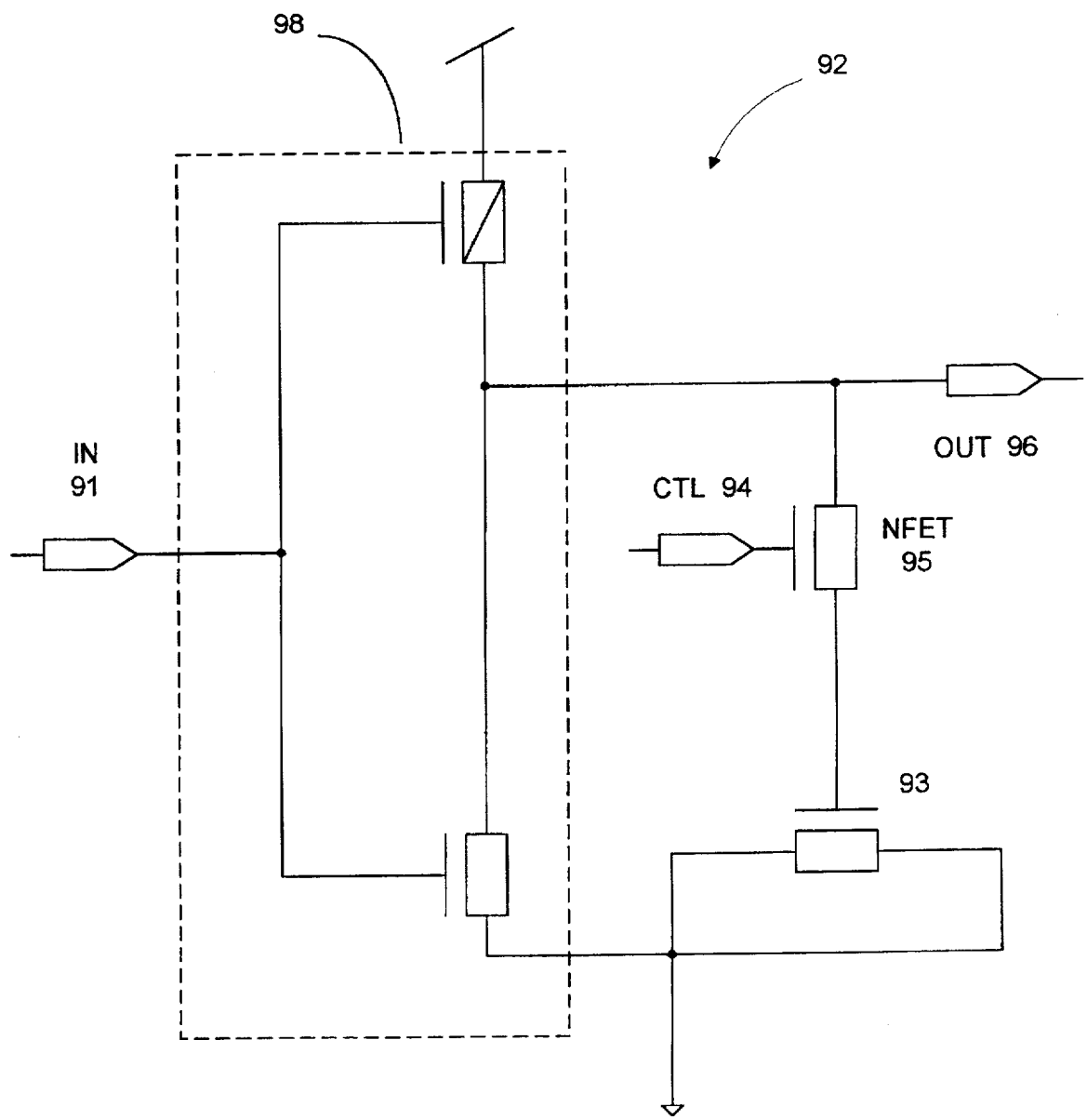
FIG. 6 depicts a circuit diagram of a controllable delay inverter diagram in accordance with the present invention.

Referring now to FIG. 2, an edge sorting circuit 20 is shown that includes four delay elements 33, 35, 37 and 39; four latches 23, 25, 27 and 29; and a four-bit word output 28. During operation, the reference clock signal 22 is fed into delay line 32 that utilizes delay elements 33, 35, 37 and 39 to create four delayed clock signals 36, 38, 40 and 42. Each delay element comprises a transistor pair suitable for causing the reference signal, or the output of a prior delay element, to be delayed by a predetermined amount of time. For example, the four delay line elements may provide time delays of 100, 200, 300 and 400 picoseconds respectively. See FIG. 3 for a timing diagram showing the reference clock signal 22, along with the four delay clock signals 36, 38, 40 and 42. (FIGS. 5 and 6 depict an alternate embodiment of a system for generating calibrated time slices using delay elements with controllable delay and a calibration circuit.) Once the delay clock signals are created, they are fed into a series of latches 23, 25, 27 and 29. Each latch captures the value of the measured clock signal (either a 1 or 0) at a specified transition edge of one of the various delay clock signals and outputs the captured value over a corresponding output line, OUTA, OUTB, OUTC or OUTD. In other words, each latch captures the value of the measured clock at a specific point in time to determine whether the transition edge occurred. If the value captured by a latch is 0, then the transition edge of the measured signal has yet to occur. If the value captured by a latch is 1, then the transition edge of the measured signal has already occurred. Thus, a four bit word 28 is generated that contains information regarding when a rising transition edge of the measured clock occurred.

Figure 3:
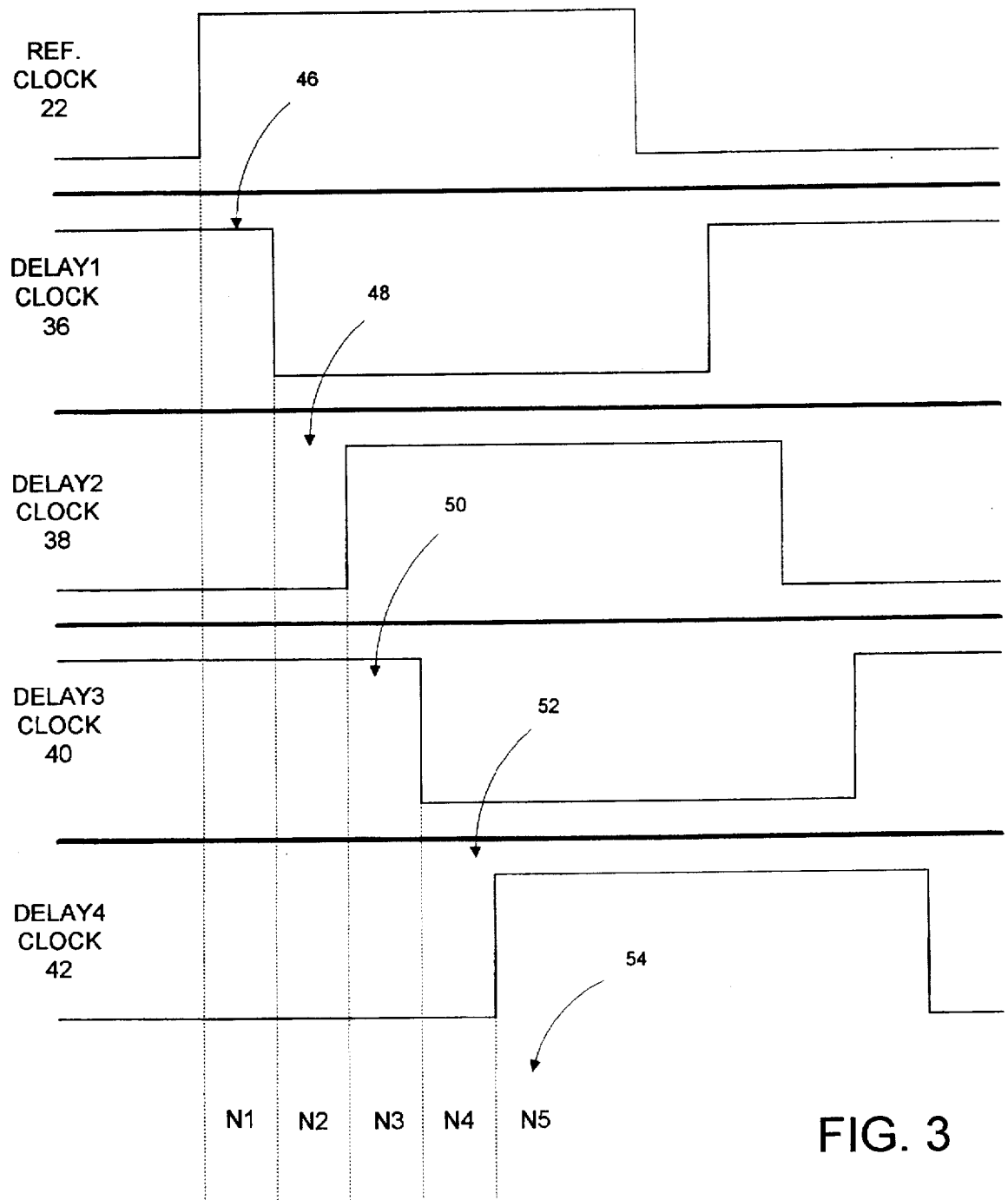
FIG. 3 depicts a timing diagram showing N−1 delayed reference clocks and N possible time slices as used in accordance with the present invention.

In the preferred embodiment, the four bit word 28 indicates the amount of jitter between the rising edge of the reference and measured clocks. In the example shown, a 0000 in the four bit word would indicate that the jitter is between 0 and 100 picoseconds, while a 1111 would indicate that the jitter is greater that 400 picoseconds. These results can be more easily illustrated by making reference to FIG. 3. In FIG. 3, the reference signal 22, along with the four delay clock signals 36, 38, 40 and 42, create five possible time slices N1–N5 (i.e., 46, 48, 50, 52 and 54) in which the rising transition edge of the measured clock signal may occur. If the transition edge of the measured clock signal falls in N1, edge sorting circuit would output a 0000 since the jitter is less than 100 picoseconds. Similarly, if the measured clock signal falls in N2, edge sorting circuit would output a 1000 since the value of each delay clocks during that time would be 0 with the exception of the first delay clock signal 36. The following table describes all possible outcomes (assuming a 100–400 picosecond (ps) time delay for the delay signals).

| TIME SLICE | OUTPUT VALUE | TIME DELAY |
|---|---|---|
| N1 | 0000 | 0–100 ps |
| N2 | 1000 | 100–200 ps |
| N3 | 1100 | 200–300 ps |
| N4 | 1110 | 300–400 ps |
| N5 | 1111 | >400 ps |

As noted above, the four bit output value of the edge sorting circuit is then fed into a decoder 14 (see FIG. 1), which in turn increments, in this case, one of five possible counters 16 (see FIG. 1) used to keep track of the number of times the measured jitter fell within each time slice. At the end of the measurement period, the counters 16 contain information regarding the relative frequency of the measured jitter with respect to the specified time slice. The contents of the counters 16 are then examined by a state machine 16 (see FIG. 1) that may search for the one with highest count and output its associated time slice as the static phase error. The state machine 16 may also examine each counter sequentially starting with the one that corresponds to the counter with the highest count (e.g., N5>N4>N3>N2>N1) and find the first non-zero count. Twice the time slice associated with that counter may be defined as the peak-to-peak jitter.

It should be recognized by those skilled in the art that any known decoder circuits (and associated logic), counters or state machines may be used in this invention. Moreover, it should also be recognized that the edge sorting device 12 shown in FIG. 2 is but one of many possible implementations for such a device. It should also be recognized that the number of delay signals created can be modified as needed to create or reduce the precision of this measuring tool.

Figure 4:
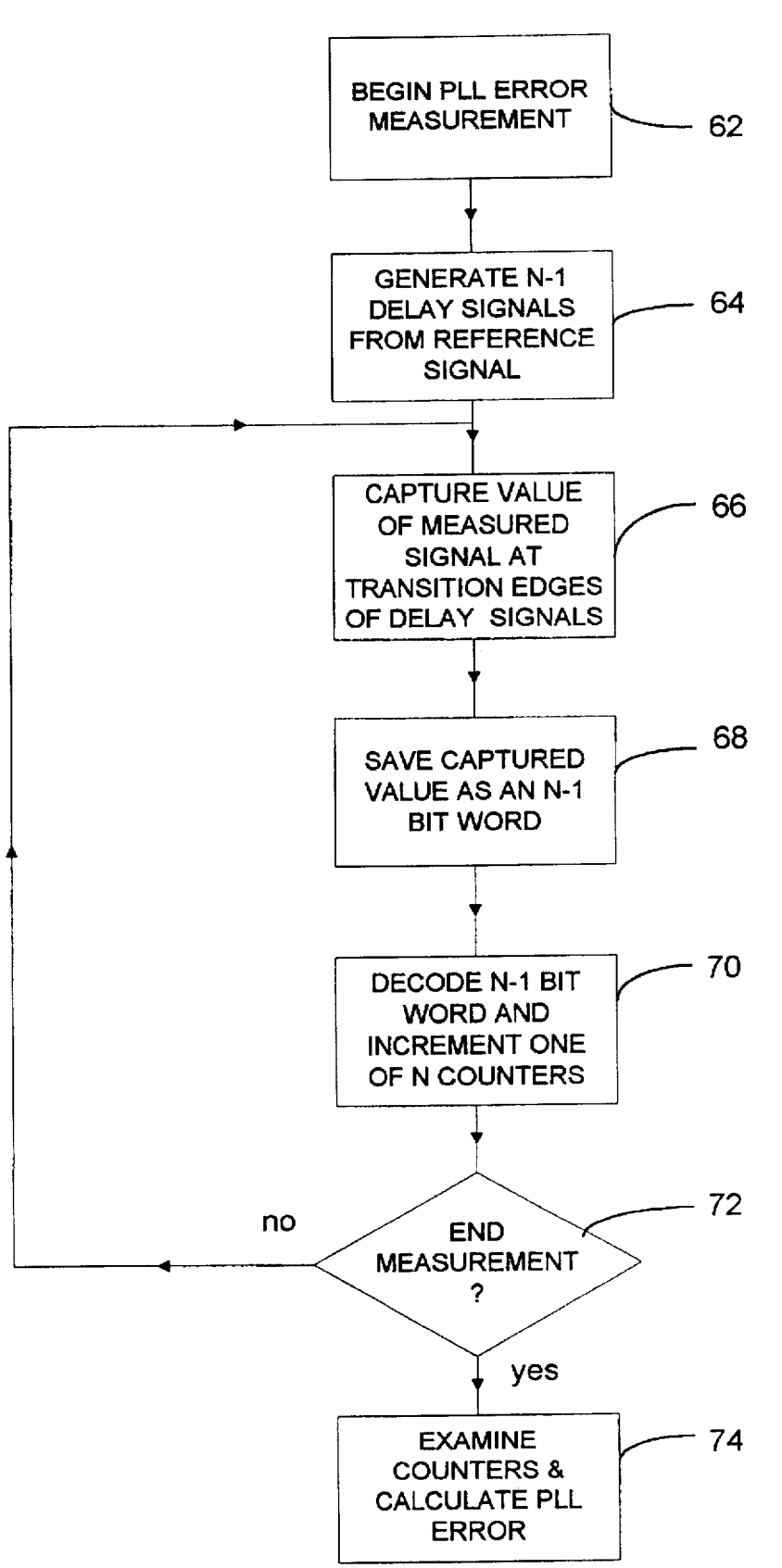
FIG. 4 depicts a flow diagram disclosing a preferred method of calculating PLL clock error in accordance with the present invention.

Referring now to FIG. 4, a flow diagram 60 is shown depicting a method for measuring PLL error. The first step 62 is to begin the PLL error measurement process. This may require pulling a reset low as was described previously. The next step 64 is to generate N−1 delay signals from the reference signal. Next, the value of the measured signal is captured at transition edges of the N−1 delay signals 66. Depending upon the system configuration, the transition edge may be a rising and/or a falling edge. Next, the captured values are stored as an N−1 bit word 68. The N−1 bit word is then decoded and one of N possible counters is incremented 70. Each counter corresponds to a time slice in which the transition edge of the measured signal may occur. Next, the system must decide whether to keep collecting values or end the measurement process 72. If the decision is made to keep collecting values, steps 66, 68 and 70 are repeated. If the system decides to end the measurement process, the counters are examined by a state machine 16 (see FIG. 1) and PLL clock error is calculated 74.

As noted above, possible definitions for PLL error include peak-to-peak jitter and static phase error. To calculate these, the state machine 16 must first search in each counter to find the highest count. Static phase error could then be defined as the time slice corresponding to the counter with the highest count. Next, the state machine must examine each counter sequentially starting with the one that corresponds to the highest delay and find the first non-zero count. Peak-to-peak jitter could be defined as twice the time slice corresponding to this counter. For example, if the first non-zero counter found was the time slice corresponding to a delay of 300 picoseconds, then the peak-to-peak jitter would be 600 picoseconds. It should be recognized that the above definitions merely provide examples of various methods of calculating PLL error. Numerous other definitions could be utilized from the information gathered.

Referring now to FIG. 5, a system 80 for generating calibrated time slices using delay elements with controllable delay and a calibration circuit is disclosed. The system includes delay elements that are modified inverters INV 1, INV 2, ... INV 100 (see FIG. 6 for an example of an inverter circuit), and can be used in place of the delay elements shown in FIG. 2. (The reference clock would be applied only to the first element in this case, unlike in FIG. 2, where it is applied to the first and third.) FIG. 5 shows the calibration circuit used to set the delay through each inverter to a specified amount. The variable delay line 83 consists of a string of inverters and the delay through each inverter is controlled by a delay control signal 85. The total delay is the sum of the inverter delays; thus for example, if the inverter delay is 50 ps and there are 100 inverters, the total delay through the delay line is 5 ns.

A high frequency test clock 84 is applied at the input of the variable delay line. It propagates through the delay line and comes out with a delay equal to the total delay. Both the test clock 84 and output clock 87 are applied to a phase detector 88 input. The phase detector output controls a charge pump 90 that charges or discharges a loop filter capacitor 86, which provides the delay control signal 85 to the variable delay line 83. The feedback loop tries to maintain zero phase shift between the test clock 84 and output clock 87. Thus, the calibration circuit works by forcing the total delay to be equal to one period of the test clock 84.

FIG. 5 shows a total of 100 inverters, each designed for a 50 ps delay. A test clock frequency of 200 MHZ may therefore be used since the total delay will be 5 ns which is one period of the test clock. It is understood however that any other number of inverters may be used.

The feedback loop control works as follows. If output clock phase leads the test clock phase, the phase detector 88 generates a charge signal through the charge pump 90 that charges up the loop filter 86. This causes an increase in the delay control voltage that causes an increase in the inverter delay. This corrective action continues until the test clock 84 and output clock 87 are in phase. At that point the charge pump 90 stops adding charge to the loop filer 86.

If the output clock phase lags the test clock phase, the phase detector 88 generates a discharge signal through the charge pump 90 that discharges the loop filter 86. This causes a decrease in the delay control voltage 85 which causes a decrease in the inverter delay. This corrective action continues until the test clock 84 and output clock 87 are in phase. At that point, the charge pump 90 stops removing charge from the loop filer 86.

By using the calibration system, the total delay is automatically adjusted to the desired amount. Process variations as well as environmental differences in temperature and power supply voltage can be automatically tuned out using this calibration circuit. The result of using the calibration circuit and the adjustable delay inverters is that accurate time slices can be created for use by the latches in the sorting circuit of FIG. 2.

FIG. 6 shows a circuit diagram of a controllable delay inverter 92 that delays input 91 and consists of a CMOS inverter 98 and a shunt-capacitor load 93. The loading effect on the CMOS inverter 98 is determined by the channel resistance of the NFET 95 connected between the inverter output 96 and the NFET load capacitor 93. The NFET resistance is controlled by the NFET gate voltage at node CTL 94 (which contains the delay control signal 85 of FIG. 5). The higher the voltage, the lower the resistance, which increases the capacitive load and thus increases the inverter delay. The delay through the inverter 92 is thus directly controllable by varying the voltage at CTL 94. FET specifications will vary as required to obtain a particular delay. The chosen delay can then be maintained in both the best and worst cases by appropriate adjustment of the delay control voltage at CTL 94.

In summary, the present invention provides a system and method for generating information regarding PLL error utilizing built in circuitry. This allows PLL's to be tested on the production line (without the use of expensive test equipment) so that hardware containing faulty PLL circuits can be identified. In particular, the invention ensures that PLL jitter is within acceptable levels. This is accomplished by using a sorting circuit to generate jitter delay information for individual clock cycles of a measured clock signal, a decoder to translate that information into one of N possible time slices, N counters to store the frequency of each time slice, and a state machine to process the counters and output one or more types of PLL error information.

The foregoing descriptions of the preferred embodiments of the invention have been presented for purposes of illustration and description. It is not intended to be exhaustive or to limit the invention to the precise form disclosed, and obviously many modifications and variations are possible in light of the above teachings. Such modifications and variations that may be apparent to a person skilled in the art are intended to be included within the scope of this invention as defined by the accompanying claims.

We claim:

1. An integrated circuit chip having a built-in circuit for measuring error of a Phase Lock Loop (PLL) output clock comprising:

a reference clock signal;

a sorting circuit that includes a plurality of calibratable delay elements for creating N−1 delayed reference clock signals and a plurality of latches for capturing the value of said PLL output clock during a plurality of transition edges of said N−1 delayed reference clock signals;

a calibration system that accurately calibrates said plurality of calibratable delay elements;

a decoder that reads in said value captured by said plurality of latches for each transition edge and subsequently increments one of N counters; and a state machine that includes logic to examine said N counters and output a PLL clock error value.

2. The integrated circuit chip of claim 1 wherein said PLL clock error value is a peak-to-peak jitter value.

3. The integrated circuit chip of claim 1 wherein said PLL clock error value is a static phase error value.

4. The integrated circuit chip of claim 1 wherein said plurality of calibrated delayed reference clocks signals are delayed in 50 picoseconds increments.

5. The integrated circuit chip of claim 1 wherein each of said plurality of transition edges of said PLL output clock is a rising edge.

6. The integrated circuit chip of claim 1 wherein each of said plurality of transition edges of said PLL output clock is a falling edge.

7. The integrated circuit chip of claim 1 wherein said calibration system comprises a feedback loop for controlling delay in said plurality of delay elements.

8. A system for measuring the error of a Phase Lock Loop (PLL) output clock comprising:

a reference clock;

an edge sorting device that includes a plurality of delay elements with controllable delay and a calibration circuit that generates calibrated time slices and that measures a delay value of each of a plurality of transition edges of said PLL output clock with reference to said reference clock and stores the delay value for each of said transition edges;

a decoder that reads in each delay value and then increments one of a plurality of counters that corresponds to the delay value; and a state machine that examines said counters and outputs an error value.

9. The system of claim 8 wherein said error value is a peak-to-peak jitter value.

10. The system of claim 8 wherein said error value is a static phase error value.

11. The system of claim 8 wherein said delay value is stored as a multi-bit value.

12. A method of determining the error of a Phase Lock Loop (PLL) output clock comprising the steps of:

measuring the time delay of a transition edge of a measured clock signal relative to a transition edge of a reference clock signal, said measuring step to include the steps of:

generating N−1 time delayed clock signals from said reference clock signal wherein each of said N−1 time delayed clock signals includes a delayed transition edge;

individually calibrating each of said N−1 time delayed clock signals with a feedback control loop;

determining a value of said measured clock signal during transition edges for each of said N−1 time delayed signals and storing said values as an N−1 bit word; and incrementing one of N possible counters corresponding to said N−1 bit word;

repeating said measuring step for a predetermined number of transition edges of said measured clock signal;

collecting a count value for each of said N counters;

processing said count value for each of said N counters; and outputting a PLL error value.

13. The method of claim 12 wherein said step of processing said count value includes the steps of:

locating the counter having the highest count; and calculating a static phase error as the time slice associated with the counter having the highest count.

14. The method of claim 13 wherein said outputted PLL error value includes said static phase error.

15. The method of claim 12 further comprising the steps of:

examining each of the N counters sequentially, beginning with the counter that is associated with the time slice having the greatest time delay;

identifying the first counter having a non-zero count; and calculating a peak-to-peak jitter as twice the time slice corresponding to said counter identified as the first counter having a non-zero count.

16. The method of claim 15 wherein said outputted PLL error value includes said peak-to-peak jitter.

17. The method of claim 12 wherein said calibration step includes the step of generating calibrated time slices using a plurality of delay elements with controllable delay and a calibration circuit.

18. The system of claim 8 wherein said controllable delay includes a feedback circuit that includes a phase detector and charge pump.

19. The integrated circuit chip of claim 7 wherein said calibration system includes a phase detector and a charge pump.

* * * * *